(12) United States Patent
Kwon

(10) Patent No.: US 6,548,377 B2
(45) Date of Patent: Apr. 15, 2003

(54) METHOD FOR FORMING A LINE OF SEMICONDUCTOR DEVICE

(75) Inventor: Tae Seok Kwon, Chungchongbuk-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 09/987,074

(22) Filed: Nov. 13, 2001

(65) Prior Publication Data

US 2002/0090807 A1 Jul. 11, 2002

(30) Foreign Application Priority Data

Nov. 22, 2000 (KR) .......................................... 2000-69657

(51) Int. Cl.[7] .............................................. H01L 1/326
(52) U.S. Cl. .................... 438/468; 438/656; 438/636; 438/648
(58) Field of Search ................... 438/656, 618, 438/627, 628, 635, 636, 654, 659, 663, 523, 468, 904

(56) References Cited

U.S. PATENT DOCUMENTS 5,891,802 A * 4/1999 Tao et al. ................... 438/656
6,096,646 A 8/2000 Lee et al. ................... 438/680
6,306,732 B1 * 10/2001 Brown ........................ 438/468

* cited by examiner

Primary Examiner—Olik Chaudhuri
Assistant Examiner—Julio J. Maldonado
(74) Attorney, Agent, or Firm—Morgan, Lewis & Bockius LLP

(57) ABSTRACT

A method for forming a line of a semiconductor device is provided, which improves the life span of the line and its reliability by improving resistance to electromigration (EM). The method for forming a line of a semiconductor device includes forming a first insulating film on a semiconductor substrate in which a lower line is formed; depositing an adhesive layer on the first insulating film; forming an upper line metal film on the adhesive layer to be connected with the lower line through a plug that passes through the first insulating film; depositing an ARC film on the upper line metal film; forming a barrier film on the upper line metal film by barrier ion implantation using a mask which exposes a predetermined region of the ARC film; selectively removing the ARC film, the upper line metal film, and the adhesive layer by photolithography and etching processes to form a plurality of trenches, so that an upper line is formed with the upper line metal film; and forming a second insulating film on an entire surface including the trenches.

11 Claims, 6 Drawing Sheets

METHOD FOR FORMING A LINE OF SEMICONDUCTOR DEVICE

BACKGROUND OF THE INVENTION

Field of the Invention

The present invention relates to a semiconductor device, and more particularly, to a method for forming a line of a semiconductor device that improves resistance to electromigration (EM) degrading due to an increase of packing density.

Background of the Invention

Recently, with the increase of packing density of a semiconductor device, a width of a line and the size of a contact hole have been decreased. For this reason, density of current applied to the line also has been increased. Accordingly, problems related to reliability of the line due to EM are becoming a major concern for the semiconductor device.

EM generally is defined as atoms constituting a line that move when current flows into the line due to electrons. Characteristics of the EM depend on at least the following factors: the types of line (i.e. material, crystalline structure, and fine structure); line width; line thickness; a contact structure; a driving current density; and an operational temperature.

Generally, to improve the EM characteristics of the line, the fine structure and the crystallization structure of the line are controlled. Additionally, an Al alloy and a layered structure are used.

Initially, the relation between the EM, the fine structure and the crystalline structure is as follows. Al has a polysilicon structure after deposition. In this case, the relationship between the EM, the fine structure and crystalline structure is expressed as Equation (1) below.

$$MTTF \alpha \frac{S}{\sigma^2} \ln\left(\frac{I_{(111)}}{I_{(200)}}\right)^3 \qquad \text{Equation (1)}$$

Here, MTTF denotes a median time to failure, S denotes a size of a grain, $\sigma$ denotes a distribution of the crystalline grain, and $$\frac{I_{(111)}}{I_{(200)}}$$

denotes (111) alignment of the line. Accordingly, the EM characteristics can be improved by greatly and uniformly maintaining the size of the grain and controlling the crystalline structure to have a (111) alignment.

The relationship between the EM and the Al alloy is as follows. If a line is formed of Al—Cu compound ($Al_3Cu$) in which an element such as a Cu atom is added to Al, Al atom mobility is reduced due to a grain boundary of the Al—Cu compound and the Cu atom is entered into the grain boundary to occupy a vacant site. Because of this, the Al atom mobility is deteriorated, thereby improving the EM characteristics.

Finally, the relationship between the EM and the layered structure is as follows. A factory metal film, such as Ti, TiN, TiW, and W, is deposited before and after deposition of the line. Thus, it is possible to prevent a short from occurring, even if a void is formed within the line. Also, since an anti-reflective coating (ARC) film prevents "Hillock" from occurring, characteristics can be improved.

A related art method for forming a line of a semiconductor device will now be described with reference to the accompanying drawings.

FIGS. 1A–1D are sectional views of a conventional process for forming a line of a semiconductor device. FIG. 2 shows a conventional internal structure of a line of a semiconductor device.

As shown in FIG. 1A, a lower line 12 is formed on a first insulating film 11, and an oxide film 13 is deposited on the lower line 12. A plug (not shown) is then formed in the oxide film 13 to electrically connect the lower line 12 with an upper line metal film 15, which will be formed later.

To improve the adhesive property between the oxide film 13 and an upper line metal film 15, which will be formed later, an adhesive layer 14 is formed on the oxide film 13. Typically, Ti or TiN is used as the adhesive layer 14. The upper line metal film 15 is formed on the adhesive layer 14. At this time, the upper line metal film 15 is formed by depositing an Al film.

As shown in FIG. 1B, an ARC film 16 is formed to prevent anti-reflection from occurring during an exposure process. A photoresist 17 is then deposited on the entire surface of the ARC film 16. Here, TiN is used as the ARC film 16.

As shown in FIG. 1C, the photoresist 17 is selectively patterned by exposure and developing processes.

As shown in FIG. 1D, the ARC film 16, the upper line metal film 15, and the adhesive layer 14 are selectively removed using the patterned photoresist 17 as a mask to expose a portion of the oxide film 13. At this time, the upper line 15a is formed by selectively removing the upper line metal film 15. Subsequently, an annealing process is performed, and a second insulating film 18 is deposited. Thus, a line of the conventional semiconductor device is completed.

In the line of the semiconductor device formed as above, since the upper line 15a is long, as shown in FIG. 2, a number of vacancies 19 occur. Additionally, the vacancies 19 move due to electron movement and current flow from the lower line 12 to the upper line 15a through a plug 21. Accordingly, the vacancies 19 are coupled to a void 20, thereby increasing the size of the void 20.

The aforementioned conventional method for forming a line of a semiconductor device has several draw-backs.

First, if the width of the line is thick, the Al line has a polysilicon structure. In this case, line short due to the void is caused as a result of the occurrence of a number of grain boundaries in which electrons can move.

Second, since the line is long, a number of vacancies occur. The void is enlarged as the vacancies are coupled to the void, thereby causing line short due to the void.

Finally, due to an increased stress of the line as a result of vacancies occurring in the line, the resistance to EM is reduced.

SUMMARY OF THE INVENTION

Accordingly, the present invention is directed to a method for forming a line of a semiconductor device that substantially obviates one or more of the problems due to limitations and disadvantages of conventional methods.

An object of the present invention is to provide a method for forming a line of a semiconductor device in which a barrier film is formed within the line to reduce a width and length of the line, thereby improving resistance to EM.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

To achieve these and other advantages and in accordance with the purpose of the present invention, as embodied and broadly described, a method for forming a line of a semiconductor device according to the present invention includes: forming a first insulating film on a semiconductor substrate in which a lower line is formed; depositing an adhesive layer on the first insulating film; forming an upper line metal film on the adhesive layer to be connected with the lower line through a plug that passes through the first insulating film; depositing an ARC film on the upper line metal film; forming a barrier film on the upper line metal film by barrier ion implantation using a mask which exposes a predetermined region of the ARC film; selectively removing the ARC film, the upper line metal film, and the adhesive layer by photolithography and etching processes to form a plurality of trenches, so that an upper line is formed with the upper line metal film; and forming a second insulating film on an entire surface including the trenches.

It is to be understood that both the foregoing general description and the following detailed description are exemplary and explanatory and are intended to provide further explanation of the invention as claimed.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Reference will now be made in detail to the preferred embodiments of the present invention, examples of which are illustrated in the accompanying drawings.

In the present invention, it is intended that short length effect or black stress effect is used to improve EM characteristics.

According to the short length effect, if a length of a line is less than a threshold length, a void is eliminated by black flow stress even if the void is formed. As an example, it is known that an EM threshold length of Cu in Al-2%Cu is about 5.3 μm. The EM threshold length of Cu is expressed as Equation 2 below.

$$V_d = V_e - V_b = \left(Je\rho Z^* - \frac{(\Omega\Delta\sigma)}{L}\right) - \frac{D_0}{KT}\exp\left(\frac{-qE_a}{kT}\right) \quad \text{Equation (2)}$$

$V_d$ denotes a total drift velocity of a material depleted in a line to which a cathode current is applied, $V_e$ denotes an EM drift velocity, and $V_b$ denotes an average drift velocity of an atom due to black flow stress. J is a current density, ρ is a unique resistance, e is a charge, $Z^*$ is an effective ion charge, Ω is a volume of an atom, Δσ is black flow stress, L is a length of the line, $D_O$ is an atom diffusion, and $E_a$ is an active energy.

The black flow stress $V_b$ increases as the length of the line decreases. Thus, mass transport decreases.

A method for forming a line of a semiconductor device according to the present invention will now be described with reference to the accompanying drawings.

Figure 1A:
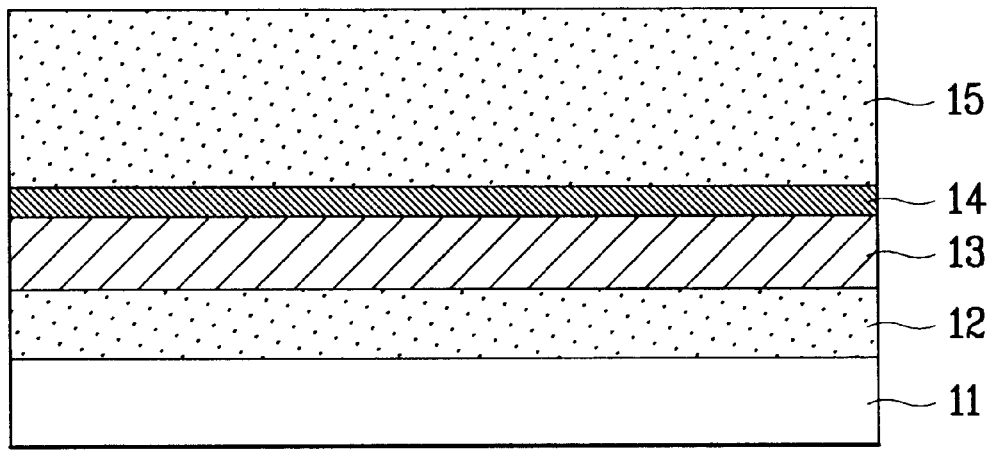
FIGS. 1A–1D are sectional views of a conventional process for forming a line of a semiconductor device.
Figure 1B:
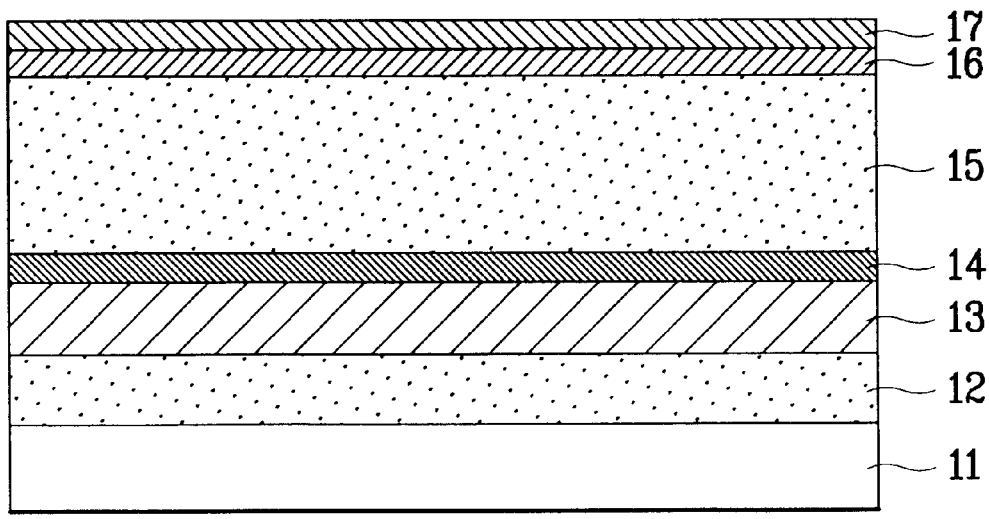
Figure 1C:
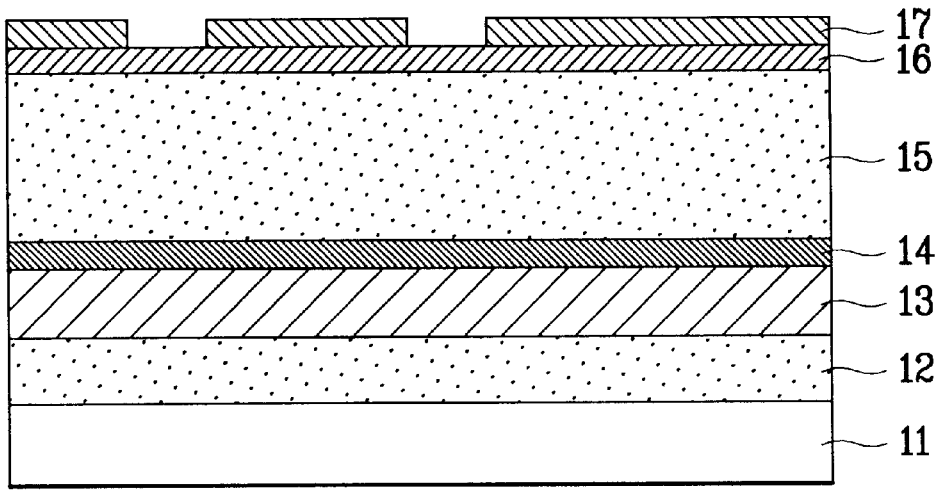
Figure 1D:
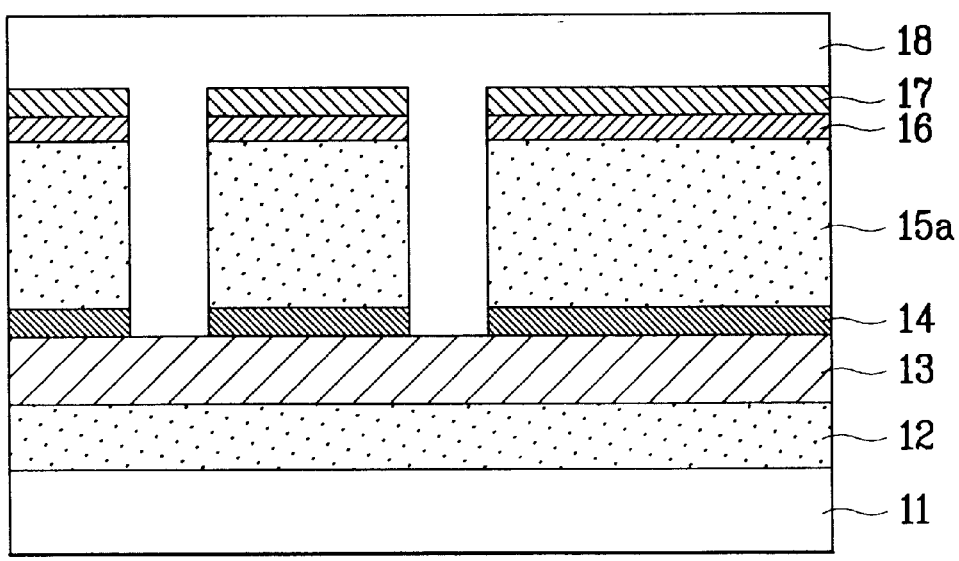
Figure 2:
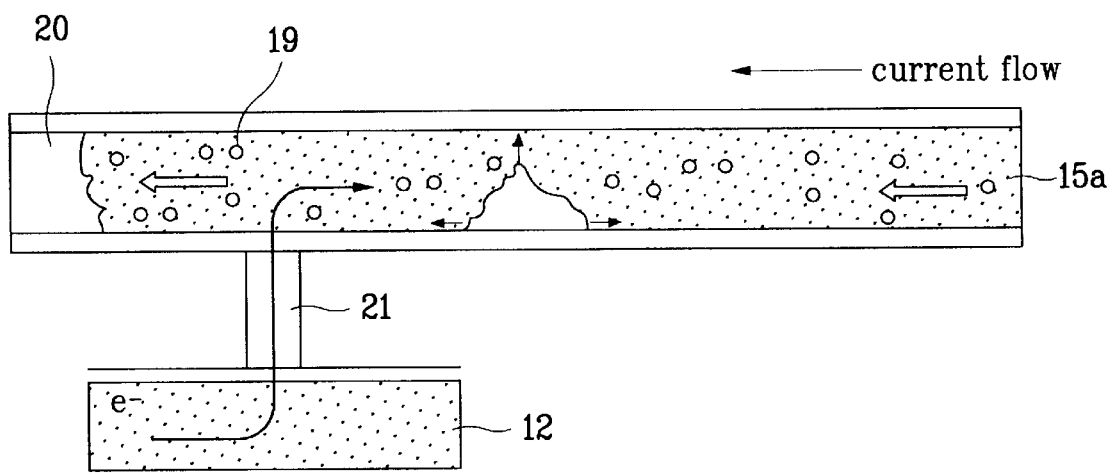
FIG. 2 shows a conventional internal structure of a line of a semiconductor device.
Figure 3:
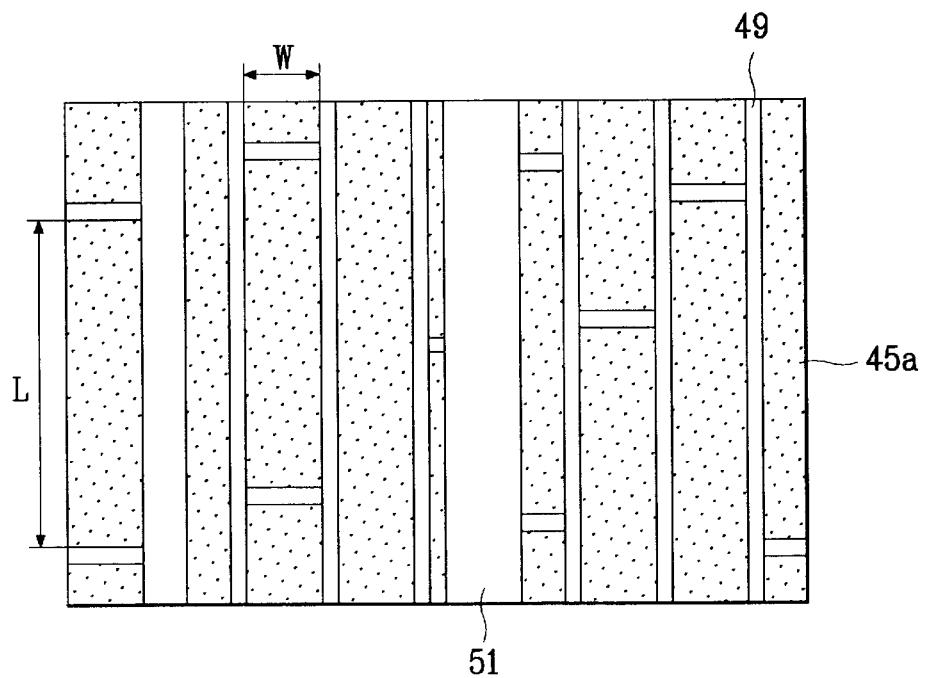
FIG. 3 is a plane view of a semiconductor device according to the embodiment of the present invention.
Figure 4A:
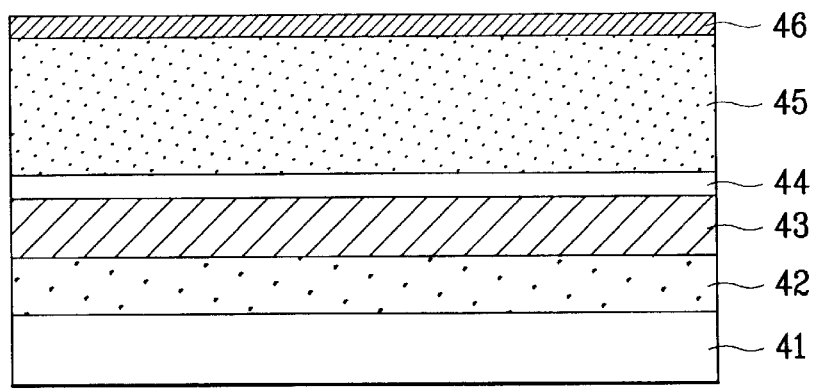
FIGS. 4A–4F are sectional views of a process for forming a line of a semiconductor device according to the embodiment of the present invention.
Figure 4B:
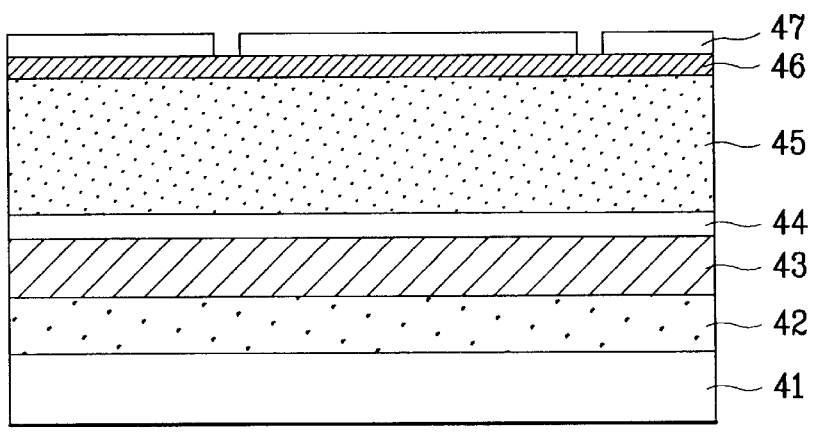
Figure 4C:
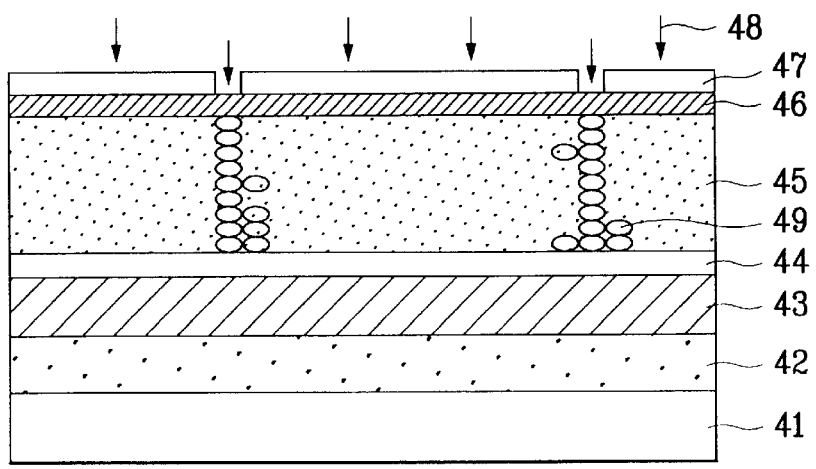
Figure 4D:
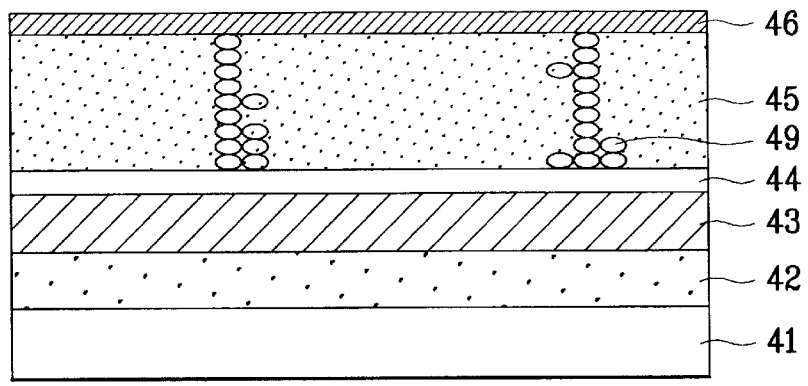
Figure 4E:
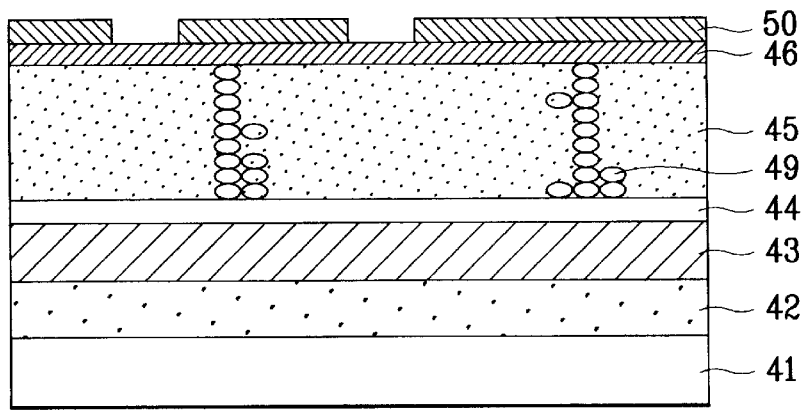

FIG. 3 is a plane view of a semiconductor device according to an embodiment of the present invention. FIGS. 4A–4F are sectional views of a process for forming a line of a semiconductor device according to the embodiment of the present invention. FIG. 5 shows an internal structure of a line of a semiconductor device according to the present invention.

Figure 4F:
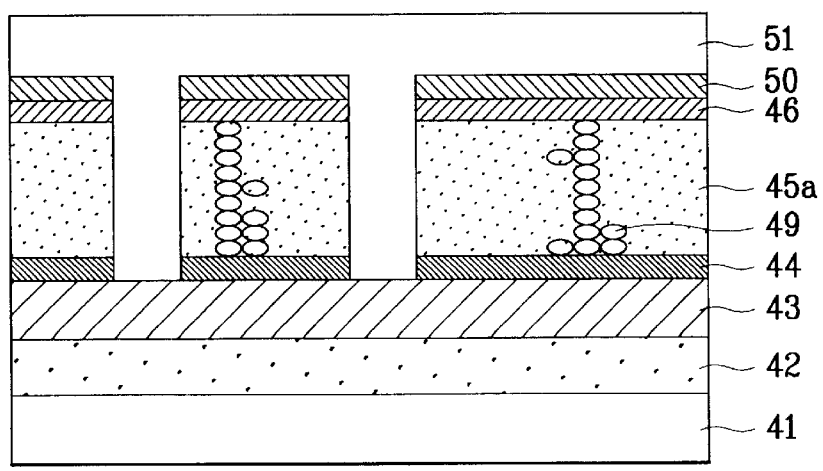
Figure 5:
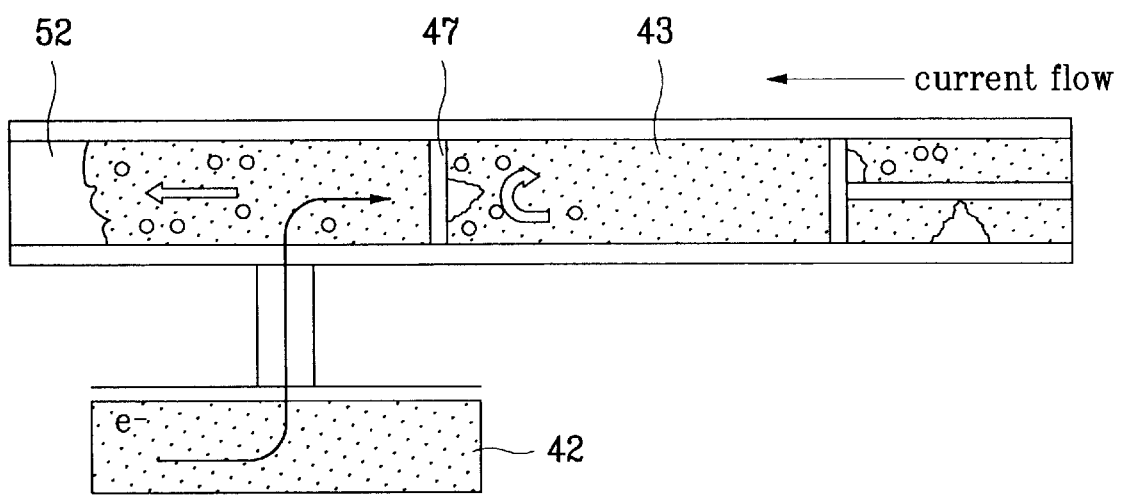
FIG. 5 shows an internal structure of a line of a semiconductor device according to the present invention.

A line structure of a semiconductor device according to an embodiment of the present invention is shown in FIGS. 3 and 4F. In FIG. 4F an upper line 45a is formed over a predetermined region of a lower line 42. An oxide film 43 is formed on a boundary surface between the lower line 42 and the upper line 45a to insulate the lower line 42 from the upper line 45a. An adhesive layer 44 is formed on a boundary surface between the oxide film 43 and the upper line 45a. A barrier film 49 is formed within the upper line 45a to cut the upper line 45a to have a width (W) of about 0.4~0.2 μm and a length (L) of about 50~300 μm, as shown in FIG. 3. An ARC film 46 is formed on the lower line 45a.

A method for fabricating the aforementioned semiconductor device will be described below.

As shown in FIG. 4A, a lower line 42 is formed on a first insulating film 41, and an oxide film 43 is deposited on the lower line 42 to insulate the lower line 43 from an upper line metal film 45, which will be formed later.

To improve adhesive property between the oxide film 43 and an upper line metal film 45, an adhesive layer 44 is formed on the oxide film 43. At this time, Ti or TiN is used as the adhesive layer 44.

The upper line metal film 45 is formed on the adhesive layer 44. An ARC film 46 is then formed on the upper line metal film 45 to prevent anti-reflection from occurring during an exposure process. At this time, Al, Cu, Ti, TiN, W, or TiW is used as the upper line metal film 45. The ARC film 46 is formed by depositing TiN of about 0.9~1.1 μm.

As shown in FIG. 4B, a first photoresist 47 is deposited on an entire surface of the ARC film 46. The photoresist 47 is selectively patterned by exposure and developing processes to expose a predetermined region of the ARC film 46. At this time, the first photoresist 47 is patterned to maintain a width and a length of the ARC film 46 which is not exposed, at about 0.4~2 μm and about 50~300 μm, respectively.

Subsequently, as shown in FIG. 4C, a barrier film 49 is formed by implanting a barrier ion 48 such as B, F, and Ar into the upper line metal film 45 below the ARC film 46 in a high current ion implantation method using the patterned first photoresist 47 as a mask. The barrier film 49 is formed within the upper line 45a to cut the upper line 45a to have a width (W) of about 0.4~0.2 μm and a length (L) of about 50~300 μm (FIG. 3).

The barrier film 49 is formed of TiN. The barrier film 49 of TiN is formed by implanting a TiN ion of the ARC film 46 into the upper line metal film 45 during implantation process of the barrier ion 48.

A grain of the upper line metal film 45 is destroyed during the ion implantation process.

Here, the barrier ion 48 has a concentration of about $10^{14}$~$10^{15}$ atoms/cm$^2$ and an ion implantation energy of about 500~600 KeV.

As shown in FIG. 4D, the first photoresist 47 is removed.

As shown in FIG. 4E, a second photoresist 50 is deposited on the entire surface and then selectively patterned by the exposure and developing processes to partially expose the ARC film 46.

The ARC film 46, the upper line metal film 45, and the adhesive layer 44 are selectively removed using the patterned second photoresist 50 as a mask to partially expose the oxide film 43 in FIG. 4F so that trenches (not shown) are formed.

At this time, the upper line 45a is formed by selectively removing the upper line metal film 45.

Subsequently, the second photoresist 50 is removed, and an annealing process is performed. A second insulating film 51 is then deposited on the entire surface.

At this time, recrystallization occurs in the upper line 45a of which grain is destroyed during the implantation process of the barrier ion 48, so that the size of the grain is grown to have a bamboo structure having no grain boundary.

As shown in FIG. 5, since a length of the upper line 45a cut by the barrier film 49 is about 300 µm or less even if a void is formed, no vacancies more than a constant amount are provided. Thus, the void 52 does not grow. There is a limitation in growing the void even if the void is formed because the width of the upper line 45a is about 3 µm or less.

As aforementioned, the method for forming a line of a semiconductor device according to the present invention has the following advantages.

First, since the metal line has a length less than a threshold length, a void is eliminated by short length effect even if the void is formed. This can prevent a short of the line from occurring.

Second, since no vacancies are provided any longer due to the barrier film even if the void is formed, the void does not increase, thereby preventing a short of the line from occurring.

Third, if the width of the line is great, the void is not grown any longer by the barrier film, thereby preventing a short of the line from occurring.

Finally, the Al grain is destroyed during the ion implantation, and recrystallization occurs due to a later annealing process. In this case, the Al grain is grown at a greater size to have a bamboo structure having no grain boundary, thereby improving resistance to EM.

The foregoing embodiments and advantages are merely exemplary and are not to be construed as limiting the present invention. The present teaching can be readily applied to other types of apparatus. The description of the present invention is intended to be illustrative, and not to limit the scope of the claims. Many alternatives, modifications and variations will be apparent to those skilled in the art. In the claims, means-plus-function clauses are intended to cover the structures described herein as performing the recited function and not only structural equivalents but also equivalent structures.

What is claimed is:

1. A method for forming a line of a semiconductor device comprising:

forming a first insulating film on a semiconductor substrate in which a lower line is formed;

depositing an adhesive layer on the first insulating film;

forming an upper line metal film on the adhesive layer to be connected with the lower line through a plug that passes through the first insulating film;

depositing an ARC film on the upper line metal film;

forming a barrier film into the upper line metal film by barrier ion implantation using a mask which exposes a predetermined region of the ARC film;

selectively removing the ARC film, the upper line metal film, and the adhesive layer by photolithography and etching processes to form a plurality of trenches, so that an upper line is formed with the upper line metal film; and forming a second insulating film on an entire surface including the trenches.

2. The method of claim 1, wherein the first insulating film is formed of an oxide film.

3. The method of claim 1, wherein the adhesive layer is formed of either Ti or TiN.

4. The method of claim 1, wherein the upper line metal film is formed of any one of Al, Cu, Ti, TiN, W, and TiW.

5. The method of claim 1, wherein the ARC film has a thickness of about 0.09~0.1 µm.

6. The method of claim 1, wherein the ARC film is formed of TiN.

7. The method of claim 1, wherein the barrier ion is any one of B, F, and Ar.

8. The method of claim 1, wherein the barrier ion has a concentration of about $10^{14}$~$10^{15}$ atoms/cm$^2$.

9. The method of claim 1, wherein the barrier ion is implanted by a high current ion implantation process.

10. The method of claim 1, wherein the barrier ion is implanted using an energy of about 500 KeV or greater.

11. The method of claim 1, wherein the barrier film is formed in such a manner that the upper line metal film cut by the barrier film has a width of about 0.4~2 µm and a length of about 50~300 µm.

* * * * *